(12) United States Patent
Miao et al.

(10) Patent No.: US 10,832,969 B2
(45) Date of Patent: Nov. 10, 2020

(54) SINGLE-FIN CMOS TRANSISTORS WITH EMBEDDED AND CLADDED SOURCE/DRAIN STRUCTURES

(71) Applicant: INTERNATIONAL BUSINESS MACHINES CORPORATION, Armonk, NY (US)

(72) Inventors: Xin Miao, Guilderland, NY (US); Choonghyun Lee, Rensselaer, NY (US); Shogo Mochizuki, Clifton Park, NY (US); Hemanth Jagannathan, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 32 days.

(21) Appl. No.: 16/160,346

(22) Filed: Oct. 15, 2018

(65) Prior Publication Data
US 2020/0118886 A1   Apr. 16, 2020

(51) Int. Cl.
*H01L 21/8238* (2006.01)
*H01L 21/8234* (2006.01)
*H01L 27/088* (2006.01)
*H01L 27/092* (2006.01)
*H01L 27/12* (2006.01)
(Continued)

(52) U.S. Cl.
CPC .. *H01L 21/823814* (2013.01); *H01L 21/8221* (2013.01); *H01L 21/823425* (2013.01); *H01L 21/823431* (2013.01); *H01L 21/823821* (2013.01); *H01L 27/0688* (2013.01); *H01L 27/0886* (2013.01); *H01L 27/0924* (2013.01); *H01L 27/1207* (2013.01); *H01L 27/1211* (2013.01); *H01L 21/823481* (2013.01); *H01L 21/823878* (2013.01)

(58) Field of Classification Search
CPC ......... H01L 21/823814; H01L 21/8221; H01L 21/823431; H01L 21/823425; H01L 21/823821; H01L 21/823878; H01L 27/0924; H01L 27/0886; H01L 27/0688; H01L 27/1211; H01L 27/1207
See application file for complete search history.

(56) References Cited

U.S. PATENT DOCUMENTS 9,202,917 B2   12/2015   Ching et al.
9,356,027 B1   5/2016   Cheng et al.
(Continued)

OTHER PUBLICATIONS

K. Cheng et al., Bottom Oxidation through STI (BOTS)—a Novel Approach to Fabricate Dielectric Isolated FinFETs on Bulk Substrates, 2014 Symposium on VLSI Technology Digest of Technical Papers, Jun. 2014.

*Primary Examiner* — Zandra V Smith
*Assistant Examiner* — Molly K Reida
(74) *Attorney, Agent, or Firm* — Tutunjian & Bitetto, P.C.; Daniel Morris (57) ABSTRACT

Semiconductor devices and methods of forming the same include forming a dummy gate over a fin, which has a lower semiconductor layer, an insulating intermediate layer, and an upper semiconductor layer, to establish a channel region and source/drain regions. Source/drain extensions are grown on the lower semiconductor layer. Source/drain extensions are grown on the upper semiconductor layer. The dummy gate is replaced with a gate stack.

17 Claims, 10 Drawing Sheets

(51) Int. Cl.
*H01L 21/822* (2006.01)
*H01L 27/06* (2006.01)

(56) References Cited

U.S. PATENT DOCUMENTS

| | | | |
|---|---|---|---|
| 9,502,540 | B1 | 11/2016 | Bedell et al. |
| 9,608,059 | B2 | 3/2017 | Cappellani et al. |
| 9,716,174 | B2 | 7/2017 | Akarvardar et al. |
| 9,812,575 | B1 | 11/2017 | Reznicek et al. |
| 9,947,773 | B2 | 4/2018 | Ching et al. |
| 10,256,158 | B1* | 4/2019 | Frougier ........... H01L 21/82385 |
| 2015/0263088 | A1* | 9/2015 | Cheng ................. H01L 29/0673 257/20 |
| 2017/0005190 | A1 | 1/2017 | Chang et al. |
| 2018/0308986 | A1 | 10/2018 | Chao et al. |
| 2019/0097011 | A1* | 3/2019 | Wu ...................... H01L 27/092 |
| 2020/0044028 | A1* | 2/2020 | Reznicek ............ H01L 29/0673 |

\* cited by examiner

SINGLE-FIN CMOS TRANSISTORS WITH EMBEDDED AND CLADDED SOURCE/DRAIN STRUCTURES

BACKGROUND

Technical Field

The present invention generally relates to semiconductor devices and, more particularly, to transistors that have a top and a bottom device on a single fin.

Description of the Related Art

As conventional fin field effect transistors (finFETs) reach their fundamental scaling limits, alternative device structures are called for to provide improvements in logic devices. This can be particularly challenging with complementary metal-oxide-semiconductor devices, where complementary and symmetrical pairs of p-type and n-type devices are used, limiting scaling density.

SUMMARY

A method of forming a semiconductor device includes forming a dummy gate over a fin, which has a lower semiconductor layer, an insulating intermediate layer, and an upper semiconductor layer, to establish a channel region and source/drain regions. Source/drain extensions are grown on the lower semiconductor layer. Source/drain extensions are grown on the upper semiconductor layer. The dummy gate is replaced with a gate stack.

A semiconductor device includes a lower fin having lower source/drain extensions. An insulating intermediate layer is formed on the lower fin. An upper fin is formed on the intermediate layer and has upper source/drain extensions. A shared gate is formed over channel regions of the lower fin and the upper fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide an n-type field effect transistor (FET) and a p-type FET on a single fin, thereby halving the amount of chip space needed for logic that needs both structures. A fin is formed from a top semiconductor strip and a bottom semiconductor strip, separated by a dielectric layer. The top and bottom strips are separately processed to form respective source/drain regions. Some embodiments of the present invention clad the top strip, while other embodiments clad the bottom strip. Strips that are not cladded have source/drain regions grown from fin sidewalls without cladding.

Thus, embodiments of the present invention provide multiple different source/drain structure options, depending on how the top and bottom strips are handled before source/drain formation. The fin itself, furthermore, may be formed in multiple different ways, with a germanium condensation process being specifically contemplated and described below. Furthermore, while it is specifically contemplated that different device conductivity types may be formed on a single fin, devices of the same conductivity type may be formed instead, pursuant to the present embodiments. It is specifically contemplated that the devices may be complementary metal-oxide-semiconductor (CMOS) transistors.

Figure 1:
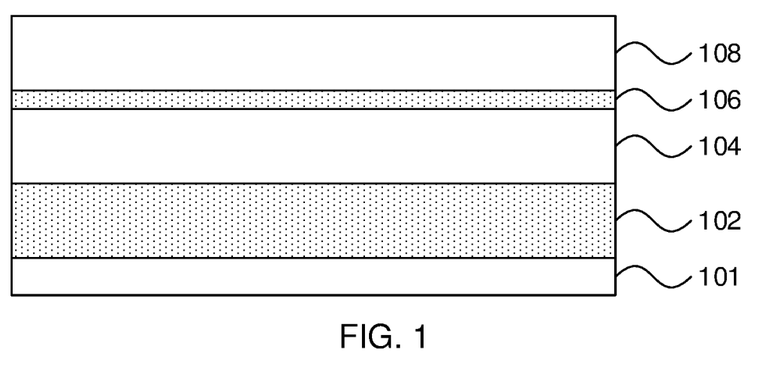
FIG. 1 is a cross-sectional diagram showing a step in the formation of a dual-fin semiconductor device with stacked channels and a shared gate that shows a stack of layers in accordance with an embodiment of the present invention.

Referring now to the drawings in which like numerals represent the same or similar elements and initially to FIG. 1, a cross-sectional diagram of a step in the formation of a single-fin, dual transistor device is shown. A first semiconductor layer 104 and a first insulator layer 102 are provided as a semiconductor-on-insulator substrate, with an underlying bulk semiconductor layer 101. An intermediate layer 106 is formed on the first semiconductor layer 104, and a second semiconductor layer 108 is formed on the intermediate layer 106.

In one example, the bulk, first, and second semiconductor layers 101, 104, and 108 may be formed from a silicon-containing material. Illustrative examples of silicon-containing materials suitable for the bulk-semiconductor substrate include, but are not limited to, silicon, silicon germanium, epitaxial silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. The first semiconductor layer 104 and the second semiconductor layer 108 are formed from an appropriate channel material and are the structure on which the respective first and second FETs are formed.

The first insulator layer 102 may be formed from silicon dioxide or any other appropriate insulator material. The intermediate layer 106 may similarly be formed from silicon dioxide, but it is specifically contemplated that other embodiments may employ a germanium condensation process to form an insulator after fins are formed. Thus, at this stage, a sacrificial material may be used for the intermediate layer 106 that includes silicon germanium. The sacrificial material may have an exemplary germanium content of about 40%.

In one embodiment, the stack of layers can be formed through a wafer bonding process. In such a process, a semiconductor-on-insulator wafer that includes a first semiconductor layer, an insulator layer, and a second semiconductor layer, is bonded to a bulk wafer that includes a bulk semiconductor layer and an insulator layer. After bonding the two wafers together, using the insulator layer of the bulk wafer to bond to one of the semiconductor layers of the semiconductor-on-insulator layer, excess material from the bulk wafer is removed and the surface is polished. The resulting stack of layers provides an intermediate layer 106 that is formed from an insulator material. Exemplary thicknesses of the layers that result from a wafer bonding process include a first insulator layer 102 having a thickness of about 20 nm, a first semiconductor layer 104 having a thickness of about 40 nm, an intermediate layer 106 having a thickness of about 20 nm, and a second semiconductor layer 108 having a thickness of about 40 nm.

In another embodiment, the stack of layers can be formed by an epitaxial growth process, where the intermediate layer 106 is epitaxially grown on the surface of the first semiconductor layer 104 and where the second semiconductor layer 108 is epitaxially grown on the surface of the intermediate layer 106. In this embodiment, it is contemplated that the intermediate layer is formed from silicon germanium, with a germanium concentration of about 40%. Exemplary thicknesses of the layers in an embodiment that uses epitaxial grown include a first insulator layer 102 having a thickness of about 20 nm, a first semiconductor layer 104 having a thickness of about 40 nm, an intermediate layer 106 having a thickness of about 10 nm, and a second semiconductor layer 108 having a thickness of about 40 nm. The thickness of the intermediate layer 106 in this embodiment is limited by the increased likelihood of crystalline flaws in the epitaxial layer.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 2:
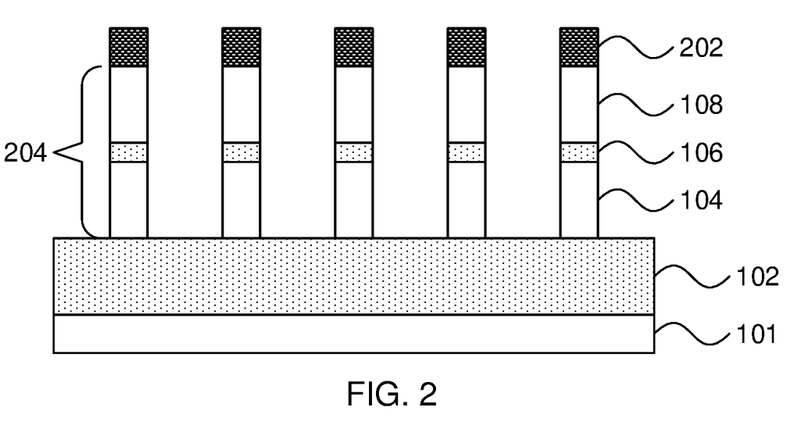
FIG. 2 is a cross-sectional diagram showing a step in the formation of a dual-fin semiconductor device with stacked channels and a shared gate that shows the formation of fins from the stack of layers in accordance with an embodiment of the present invention.

Referring now to FIG. 2, a cross-sectional diagram of a step in the formation of a single-fin, dual transistor device is shown. Masks 202 are formed on the second semiconductor layer 108 using a photolithographic process. The masks 202 are then used to form fins 204 from the stack of layers, each fin having a piece of the first semiconductor layer 104, the intermediate layer 106, and the second semiconductor layer 108. It is specifically contemplated that the fins 204 may be formed by a series of selective anisotropic etches such as, e.g., a reactive ion etch (RIE). As used herein, the term "selective" in reference to a material removal process denotes that the rate of material removal for a first material is greater than the rate of removal for at least another material of the structure to which the material removal process is being applied RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fins 204 can be formed by spacer imaging transfer.

In embodiments where the initial stack of layers is formed by epitaxial growth and the intermediate layer 106 is formed from silicon germanium, an additional step is performed to convert the intermediate layer 106 to an insulator.

Figure 3:
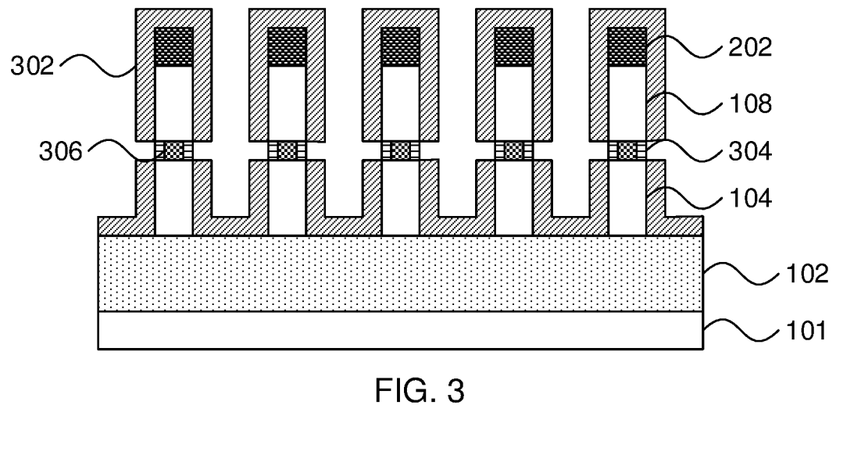
FIG. 3 is a cross-sectional diagram showing a step in the formation of a dual-fin semiconductor device with stacked channels and a shared gate that shows an embodiment that forms a dielectric layer from the oxidation of an intermediate layer in accordance with an embodiment of the present invention.

Referring now to FIG. 3, a cross-sectional diagram of a step in the formation of a single-fin, dual transistor device is shown. This figure shows a step of converting intermediate layer 106 into a dielectric material in embodiments that epitaxially grow the intermediate layer 106 on the first semiconductor layer 104. A layer of activating material is conformally deposited over the fins 204 using any appropriate deposition process (e.g., chemical vapor deposition (CVD), atomic layer deposition (ALD), or physical vapor deposition (PVD)). An anneal is performed that causes the activating material to react in regions with the intermediate layer 106, consuming the activating material and leaving a remaining activating layer 302.

In an embodiment that uses a silicon germanium material for the sacrificial layer, germanium dioxide is used for the activating material. The anneal causes the germanium dioxide to oxidize the silicon germanium in a condensation process, where oxygen from the germanium dioxide binds with silicon in the intermediate layer 106, forcing germanium in the intermediate layer 106 to migrate inward. The remaining germanium monoxide is volatile and escapes as a gas. This converts outer portions of the intermediate layer 106 into silicon dioxide and causes the germanium concentration of the inner portion to increase (e.g., to about 60% germanium). In such an embodiment, an exemplary anneal may be performed at about 600° C. for about 30 seconds in a nitrogen ambient atmosphere. In some embodiments, additional mechanical support may be provided by depositing a layer of, e.g., silicon nitride over the fins and the activating material, before the anneal is performed.

A further oxidation process is then performed, converting the inner portion of the intermediate layer 106 to a dielectric as well. In embodiments where the intermediate layer 106 is formed from silicon germanium, the end product is a layer that has outer portions of silicon dioxide and an inner portion of silicon germanium oxide. The oxidation process may be performed, for example, at about 550° C. The oxidation of the first semiconductor fin 104 and the second semiconductor fin 108 is minimal. In one embodiment, the outer portions may have a lateral thickness of about 5 nm. A nitridation process may then be performed in an ammonia ambient atmosphere to convert the outer portions to silicon oxynitride. The resulting structure replaces the intermediate layer 106 with a layer that has outer portions 304 formed from silicon oxynitride and inner portions formed from silicon germanium oxide 306. At this point, the remaining activating layer 302 can be washed away to expose the fins 204 for subsequent processing.

Figure 4:
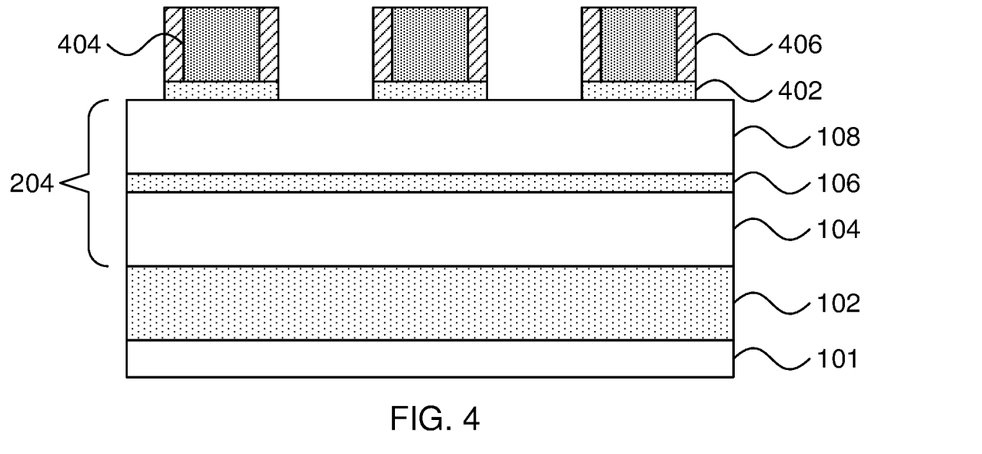
FIG. 4 is a cross-sectional diagram showing a step in the formation of a dual-fin semiconductor device with stacked channels and a shared gate that shows the formation of dummy gates over fins in accordance with an embodiment of the present invention.

Referring now to FIG. 4, a cross-sectional diagram of a step in the formation of a single-fin, dual transistor device is shown. The cross-section in this figure is shown parallel to a fin 204. Dummy gates 404 are formed on the fin(s) 204, with an underlying dielectric layer 402 and sidewall spacers 406 being formed around them. It is specifically contemplated that the underlying dielectric 402 may be formed from an oxide and that the sidewalls spacers 406 may be formed from silicon nitride, while the dummy gate 404 itself may be formed from amorphous silicon, but it should be understood that any appropriate materials may be used instead.

Figure 5:
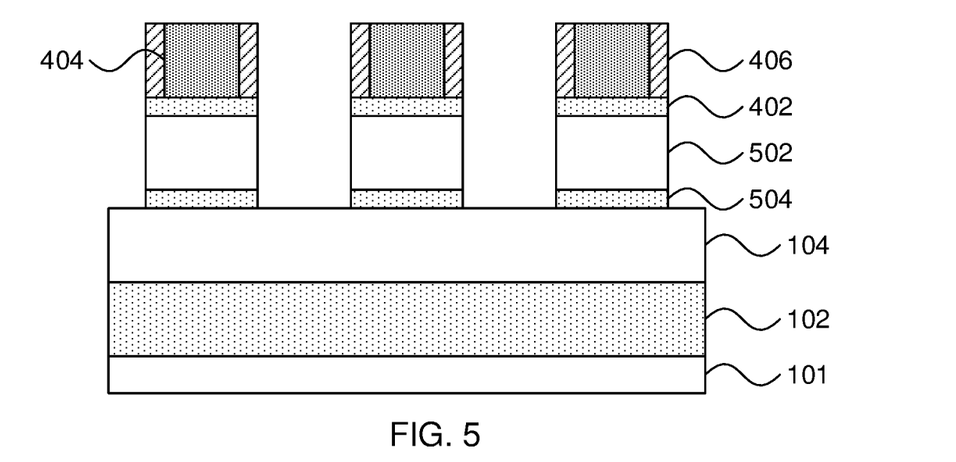
FIG. 5 is a cross-sectional diagram showing a step in the formation of a dual-fin semiconductor device with stacked channels and a shared gate that shows etching away source and drain regions of a top semiconductor fin in accordance with an embodiment of the present invention.

Referring now to FIG. 5, a cross-sectional diagram of a step in the formation of a single-fin, dual transistor device is shown. The cross-section in this figure is shown parallel to a fin 204. The dummy gates 404 and sidewall spacers 406 are used as a mask for an anisotropic etch to remove material from the second semiconductor layer 108 and the intermediate layer 106, forming channel-region second semiconductor layer sections 502 and channel-region intermediate layer sections 504. The etch exposes the first semiconductor layer 104 in source/drain regions of the fin. It is specifically contemplated that two different selective etches may be used to etch the respective layers, such that the first semiconductor layer 104 is unharmed. However, alternative embodiments may use a single timed etch, or may use imperfectly selective etches, such a small amount of material is removed from the top of the first semiconductor layer 104.

The embodiment of FIG. 5 shows a particular embodiment that etches away material from the second semiconductor layer 108. In such an embodiment, the first semiconductor layer 104 will be cladded with source/drain material. In other embodiments, to be described in greater detail below, the second semiconductor layer 108 is not etched and is cladded instead.

Figure 6:
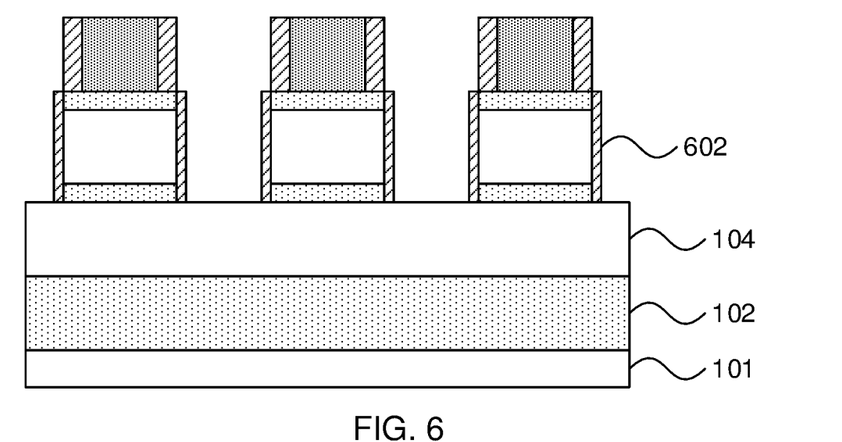
FIG. 6 is a cross-sectional diagram showing a step in the formation of a dual-fin semiconductor device with stacked channels and a shared gate that shows the formation of a protective layer on the remaining portions of the top semiconductor fin in accordance with an embodiment of the present invention.

Referring now to FIG. 6, a cross-sectional diagram of a step in the formation of a single-fin, dual transistor device is shown. The cross-section in this figure is shown parallel to a fin 204. A protective layer 602 is formed on the sidewalls of the channel-region sections 502 and 504 and the sidewall spacers 406 by conformally depositing any appropriate material and anisotropically etching the material from horizontal surfaces. The anisotropic etch furthermore is performed for long enough that the sidewalls of the first semiconductor layer 104, in regions not covered by the dummy gate, are freed from the protective layer 602. It is specifically contemplated that the protective material will be incompatible with a subsequent epitaxial growth process, such that epitaxial material will not grow on the protected surfaces.

It should be understood that the depiction of FIG. 6 is not perfectly to scale with respect to the relative heights of the dummy gates 404, the sidewall spacers 406, and the protective layer 602. In one exemplary embodiment, the dummy gate 404 and the sidewall spacers 406 may be formed to a height of between about 100 nm and about 150 nm, while the first semiconductor layer may have a height of about 40 nm. Thus, there is sufficient material in the protective layer 602 to remain on the sidewalls of the second semiconductor layer sections 502 to protect those structures from subsequent processing steps while still exposing the sidewalls of the first semiconductor layer 104 in source/drain regions.

Figure 7:
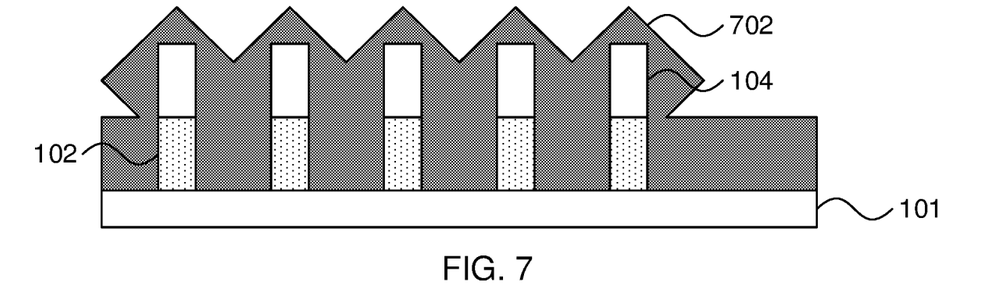
FIG. 7 is a cross-sectional diagram showing a step in the formation of a dual-fin semiconductor device with stacked channels and a shared gate that shows the formation of lower source/drain extensions on the bottom semiconductor fin in accordance with an embodiment of the present invention.

Referring now to FIG. 7, a cross-sectional diagram of a step in the formation of a single-fin, dual transistor device is shown. The cross-section in this figure is shown perpendicular to a fin 204 in a source/drain region. An epitaxial growth process is used to clad the first semiconductor layer 104, creating source/drain extensions 702. It is specifically contemplated that silicon germanium may be grown with in situ boron doping to form the source/drain regions of a p-type device, but it should be understood that any appropriate semiconductor material and dopant may be used instead, including those appropriate for an n-type device.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

In this embodiment, the first insulator layer 102 is shown as being etched back to the underlying bulk semiconductor layer 101. The epitaxial growth process deposits semiconductor material on the underlying bulk semiconductor layer 101, causing a continuous lower layer to form and merge with the source/drain extensions 702. It is specifically contemplated that the source/drain extensions 702 may be merged with one another, but alternative embodiments may limit the growth process to keep the extensions 702 from the respective fins from contacting one another.

Figure 8:
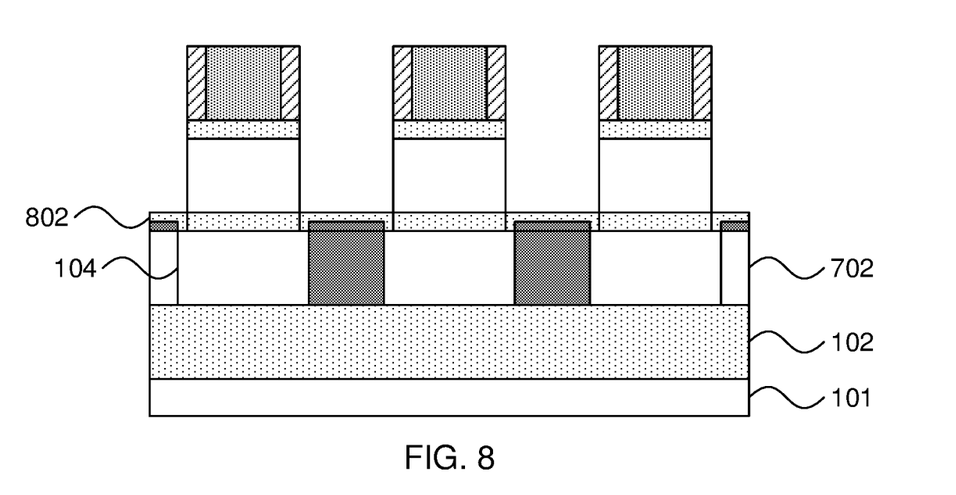
FIG. 8 is a cross-sectional diagram showing a step in the formation of a dual-fin semiconductor device with stacked channels and a shared gate that shows the formation of a passivating dielectric over the lower source/drain extensions in accordance with an embodiment of the present invention.

Referring now to FIG. 8, a cross-sectional diagram of a step in the formation of a single-fin, dual transistor device is shown. The cross-section in this figure is shown parallel to a fin 204. The source/drain extensions 702 are shown, although strictly speaking only portion that rises above the top level of the first semiconductor layer 104 would be visible in this cross-section. The protective layer 602 is stripped away and an insulator cap 802 is formed over the source/drain extensions 702.

The insulator cap 802 may be formed from, e.g., silicon dioxide and may be deposited by, for example, a flowable CVD process followed by a selective anisotropic etch that etches back the height of the deposited material to or below the height of the intermediate layer 106. It should be understood that any appropriate insulating material and deposition process may be used instead. The insulator cap 802 forms an insulating barrier between the source/drain regions of the lower device and the upper device.

Figure 9:
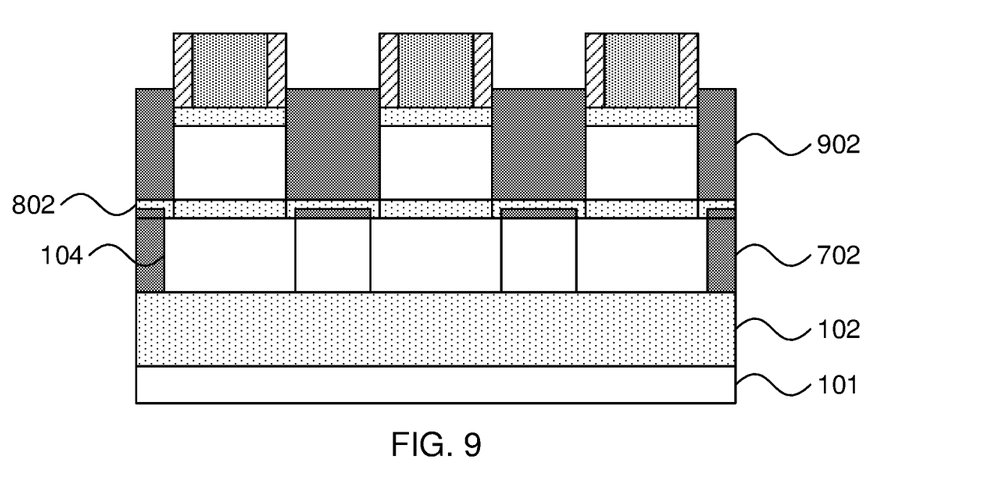
FIG. 9 is a cross-sectional diagram showing a step in the formation of a dual-fin semiconductor device with stacked channels and a shared gate that shows the formation of upper source/drain extensions on the top semiconductor fin in accordance with an embodiment of the present invention.

Referring now to FIG. 9, a cross-sectional diagram of a step in the formation of a single-fin, dual transistor device is shown. The cross-section in this figure is shown parallel to a fin 204. A top source/drain region 902 is epitaxially grown from exposed sidewalls of the etched second semiconductor layer 108. The resulting epitaxial material grows in an "embedded" pattern rather than cladding a semiconductor fin. It is specifically contemplated that the epitaxial material may be phosphorous-doped silicon to form an n-type device, though it should be understood that any appropriate semiconductor and dopant may be used instead.

Figure 10:
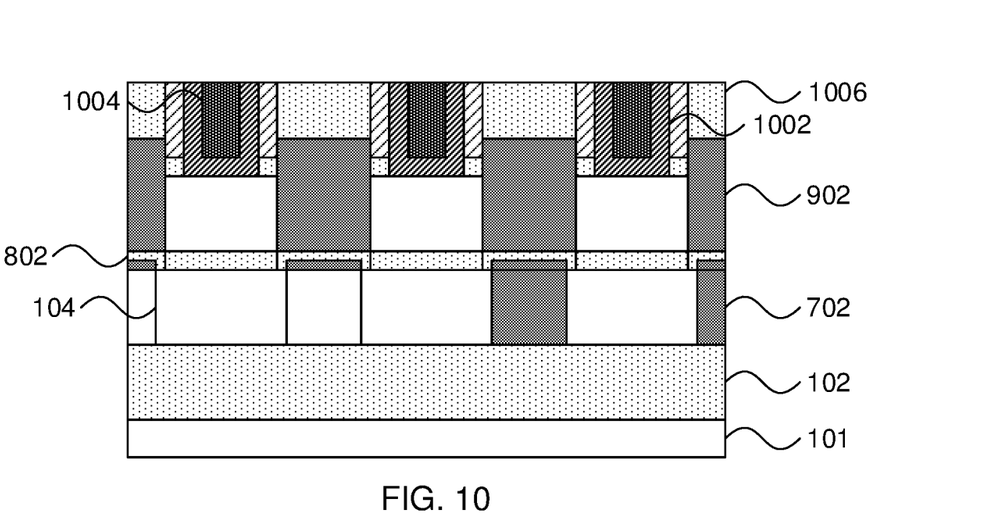
FIG. 10 is a cross-sectional diagram showing a step in the formation of a dual-fin semiconductor device with stacked channels and a shared gate that shows the formation of a top passivating layer over the upper source/drain extensions and the replacement of the dummy gate with a gate stack in accordance with an embodiment of the present invention.

Referring now to FIG. 10, a cross-sectional diagram of a step in the formation of a single-fin, dual transistor device is shown. The cross-section in this figure is shown parallel to a fin 204. A passivating layer 1006 is formed by depositing, for example, a flowable oxide and polishing the material down using chemical mechanical planarization (CMP). The dummy gate 404 is then replaced by a gate stack that includes, for example, a gate dielectric 1002 and a gate conductor 1004. Some embodiments may include a work function metal layer (not shown) between the gate dielectric layer 1002 and the gate conductor 1004. The selection of gate materials and work function materials provides the ability to further tune the electronic characteristics of the devices including, for example, the threshold voltage of the devices.

CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer.

The gate dielectric layer 1002 may be formed from any appropriate dielectric material including, for example, a high-k dielectric material. The gate dielectric layer 1002 may be formed by, e.g., conformally depositing the material and then polishing it away from the top surface of the device using a CMP process. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 1004 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1004 may alternatively be formed from a doped semiconductor material such as, e.g., doped polysilicon. The gate conductor 1004 may be formed by, for example, depositing sufficient conductive material to fill any remaining gap over the gate dielectric layer 1002 and then polishing away any excess material using, e.g., a CMP process. In some embodiments, the excess gate dielectric material and the excess gate conductor material may be removed by a single CMP process.

Figure 11:
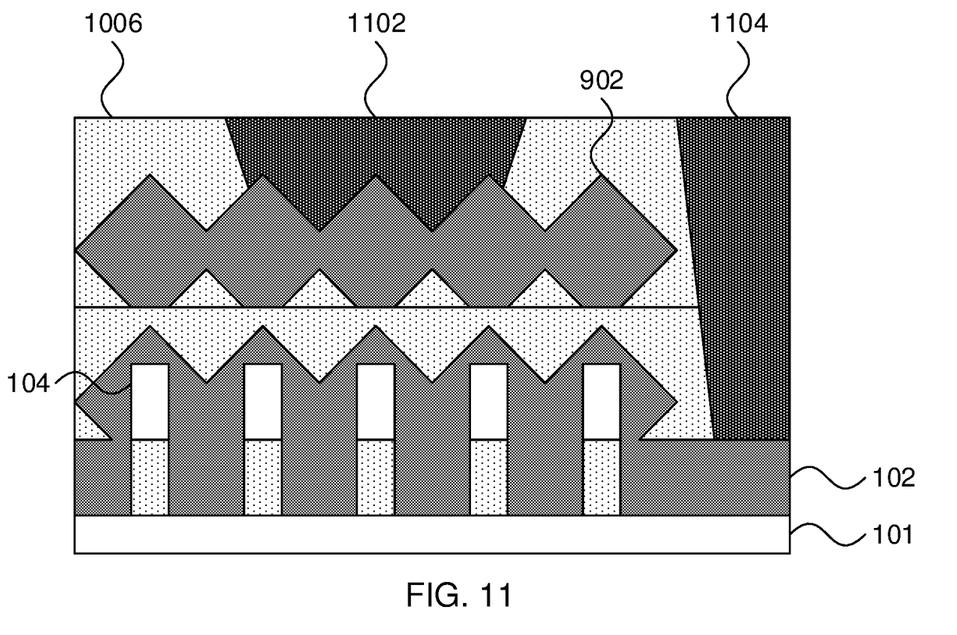
FIG. 11 is a cross-sectional diagram showing a step in the formation of a dual-fin semiconductor device with stacked channels and a shared gate that shows the formation of conductive contacts in accordance with an embodiment of the present invention.

Referring now to FIG. 11, a cross-sectional diagram of a step in the formation of a single-fin, dual transistor device is shown. The cross-section in this figure is shown perpendicular to a fin 204 in a source/drain region. The upper source/drain region 902 is shown over the lower source/drain region 702, with passivating dielectric layers 802 and 1006 between them. A top contact 1102 and a bottom contact 1104 are formed by etching vias through the passivating dielectric layers to reach the respective upper source/drain region 902 and lower source/drain region 702. Conductive material is then deposited in the vias to form electrical contacts to the respective devices. Such contacts are formed in both a source and a drain region of the devices.

As noted above, the present embodiments thereby provide stacked finFETs that share a gate and that may have different electronic characteristics (e.g., differing by conductivity type or device threshold). In the particular embodiment described above, the bottom source/drain extensions 702 are formed by cladding a fin from the first semiconductor layer 104, while the fin of the second semiconductor layer 106 is etched away and replaced by embedded epitaxial material in the form of the upper source/drain extensions 902.

Figure 12:
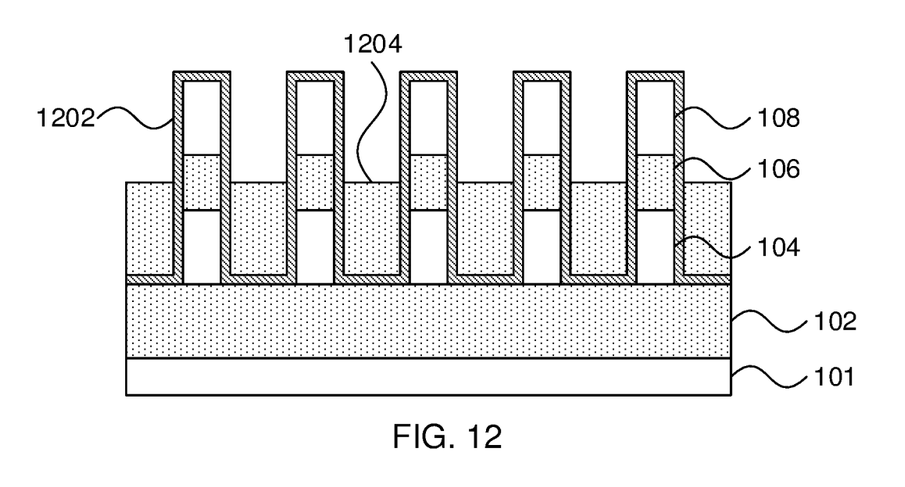
FIG. 12 is a cross-sectional diagram showing a step in an alternative embodiment of the formation of a dual-fin semiconductor device with stacked channels and a shared gate that shows formation of protective layers at the bottom of the fins in accordance with an embodiment of the present invention.

Referring now to FIG. 12, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. A first protective layer 1202 is formed over the fins 204. A fill 1204 is deposited by, e.g., a flowable CVD process and is then etched back, with a height of the fill 1204 coming within a thickness of the intermediate layer 106. The first protective layer 1202 serves to protect the intermediate layer 106 from etches performed on the fill 1204. The first protective layer 1202 may be formed from a material that is selectively etchable relative to the fill 1204 and it is specifically contemplated that silicon nitride may be used for the first protective layer 1202 and that silicon dioxide may be used for the fill 1204.

Figure 13:
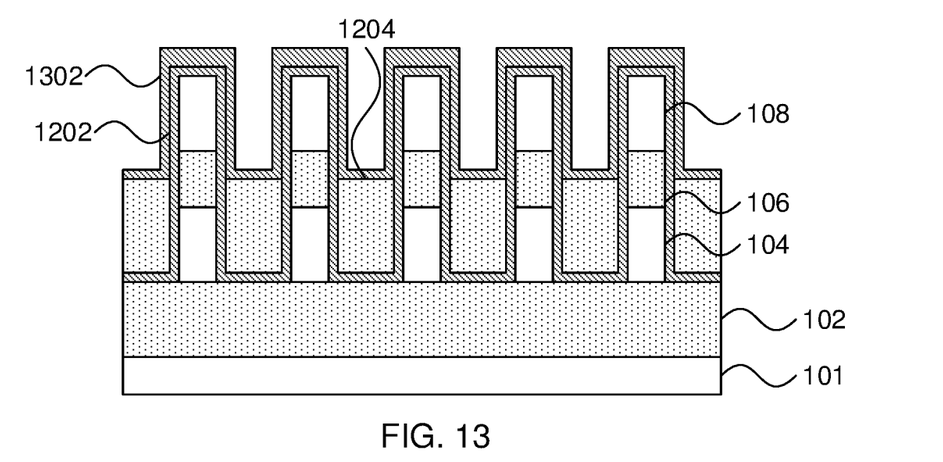
FIG. 13 is a cross-sectional diagram showing a step in an alternative embodiment of the formation of a dual-fin semiconductor device with stacked channels and a shared gate that shows formation of protective layers at the top of the fins in accordance with an embodiment of the present invention.

Referring now to FIG. 13, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. A second protective layer 1302 is deposited over the first protective layer 1202. It is specifically contemplated that a directional or semi-directional deposition process is used to form the second protective layer 1302, such that a larger amount of material is formed on horizontal surfaces. Examples of a directional deposition process include a directional PVD, a high density plasma deposition, and gas cluster beam ion deposition.

Figure 14:
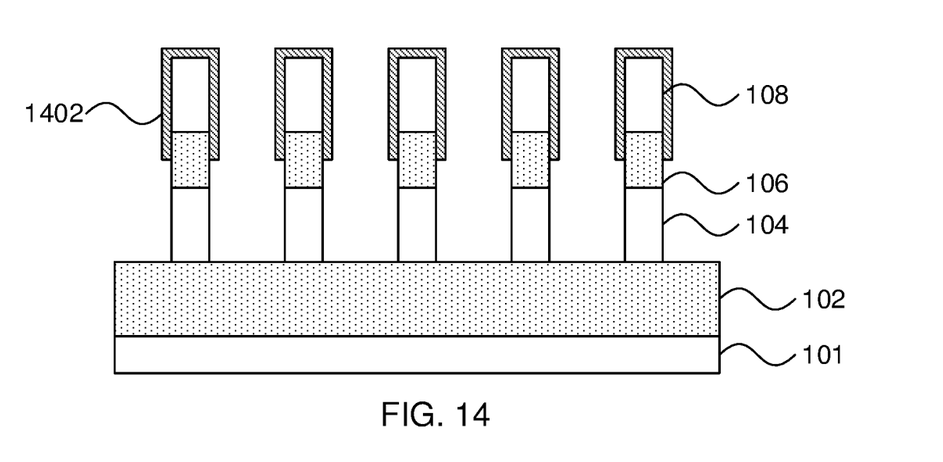
FIG. 14 is a cross-sectional diagram showing a step in an alternative embodiment of the formation of a dual-fin semiconductor device with stacked channels and a shared gate that shows removal of the protective layers from the bottom of the fins in accordance with an embodiment of the present invention.

Referring now to FIG. 14, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. An opening is formed in the second protective layer 1302 using an anisotropic etch and the underlying fill 1204 is then etched away using any appropriate etch, with a wet or dry isotropic etch being particularly contemplated. The first protective layer 1202 and the second protective layer 1302 are then etched back using an isotropic etch, leaving only top protective layer 1402 that covers the second semiconductor layer 108. Because the second protective layer 1302 had a larger amount of material on vertical surfaces, some remains to cover the top of the fins 204.

Figure 15:
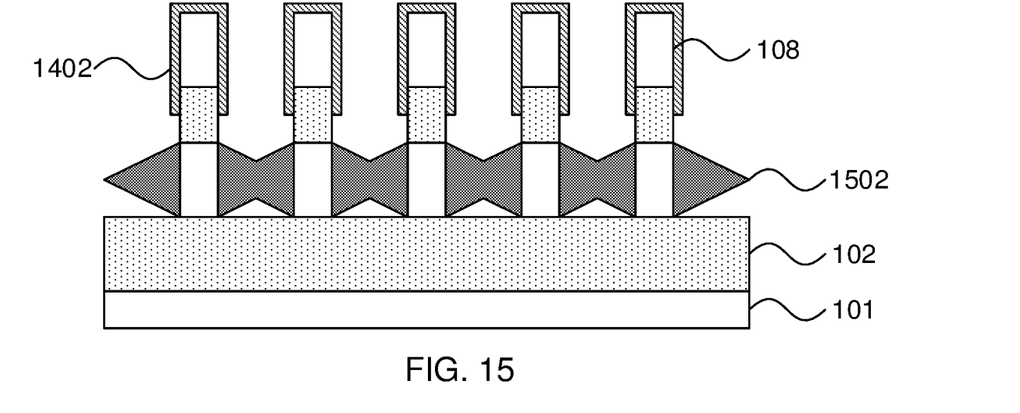
FIG. 15 is a cross-sectional diagram showing a step in an alternative embodiment of the formation of a dual-fin semiconductor device with stacked channels and a shared gate that shows formation of lower source/drain extensions in accordance with an embodiment of the present invention.

Referring now to FIG. 15, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. Lower source/drain extensions 1502 are epitaxially grown from sidewalls of the first semiconductor layer 104. Any appropriate epitaxial material may be used including, for example, silicon germanium with in situ boron doping. Because only the sidewalls of the fins of first semiconductor material 104 are exposed, the epitaxial growth pattern is different from what would result if the fin were cladded.

Figure 16:
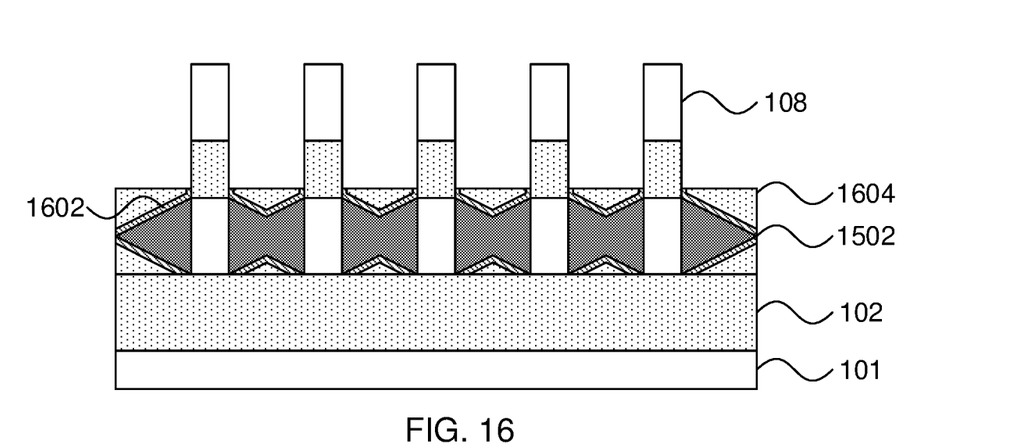
FIG. 16 is a cross-sectional diagram showing a step in an alternative embodiment of the formation of a dual-fin semiconductor device with stacked channels and a shared gate that shows removal of the protective layer from the top of the fins and formation of a passivating layer over the lower source/drain extensions in accordance with an embodiment of the present invention.

Referring now to FIG. 16, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. The top protective layer 1402 is etched away and a layer of protective material is formed over the lower source/drain extensions 1502. The layer of protective material may be formed by a conformal deposition process from, e.g., silicon nitride. A fill 1604 is deposited over the lower source/drain extensions 1502 by, e.g., a flowable CVD process and is then etched back to expose at least a portion of the intermediate layer 106. The fill 1604 may be formed from, e.g., silicon dioxide. Any exposed portions of the layer of protective material is etched away, leaving behind bottom protective layer 1602. The second semiconductor layer 108 is exposed.

Figure 17:
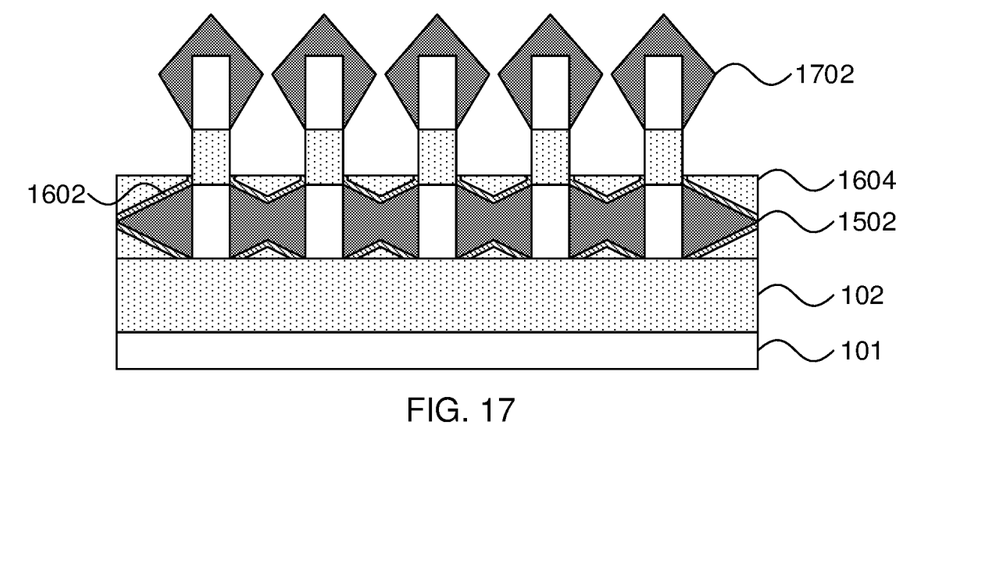
FIG. 17 is a cross-sectional diagram showing a step in an alternative embodiment of the formation of a dual-fin semiconductor device with stacked channels and a shared gate that shows formation of upper source/drain extensions in accordance with an embodiment of the present invention.

Referring now to FIG. 17, a cross-sectional diagram of a step in an alternative embodiment of the formation of a single-fin, dual transistor device is shown, where the top device is formed with a cladded source/drain region. The cross-section in this figure is shown perpendicular to a fin 204 in a source/drain region. Upper source/drain extensions 1702 are epitaxially grown to clad the second semiconductor layer 108. Any appropriate epitaxial material may be used including, for example, silicon with in situ phosphorus doping. In this embodiment, the upper source/drain extensions 1702 clad the fin, creating a different epitaxial growth pattern than that shown by the lower source/drain extensions 1502.

The upper source/drain extensions 1702 can be merged or left unmerged according to a degree of epitaxial growth. After this, the upper source/drain extensions 1702 can be surrounded by a passivating dielectric and electrical contacts may be made to each device. To reach the bottom device, electrical contact can be made to a dummy fin, with the merged lower source/drain extensions 1502 providing electrical contact across the fins.

Figure 18:
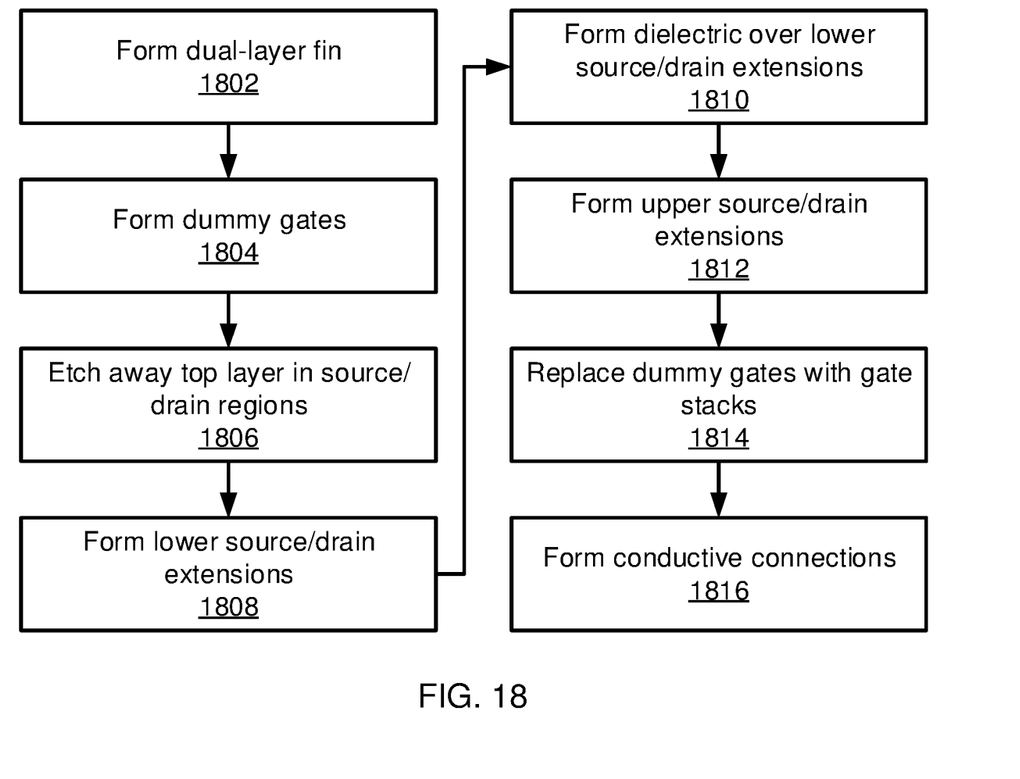
FIG. 18 is a block/flow diagram of an embodiment of a method for forming a dual-fin semiconductor device with stacked channels and a shared gate in accordance with an embodiment of the present invention.

Referring now to FIG. 18, a method of forming a two-device layered finFET with a cladded lower source/drain region is shown. Block 1802 forms dual-layered fins 204 in one of the manners described above. For example, the dual-layered fins 204 can be formed by wafer bonding or by converting a sacrificial semiconductor layer to a dielectric. Block 1804 forms dummy gates 404 over the fins 204 and block 1806 etches away the top semiconductor layer 108 in source/drain regions that are not covered by the dummy gates 404, exposing the underlying semiconductor layer 104.

Block 1808 forms a protective layer 602 on sidewalls of the fins and epitaxially grows lower source/drain extensions 702 on the lower semiconductor layer 104, forming a doped, cladding structure over the lower semiconductor layer 104. Block 1810 forms a dielectric layer 802 over the lower source/drain extensions 702 to protect the lower source/drain extensions 702 from subsequent processing steps.

Block 1812 removes the protective layer 602 and forms upper source/drain extensions 902 by epitaxial growth, forming embedded doped source/drain structures. Block 1814 replaces the dummy gates 404 with respective gate stacks and block 1816 forms conductive contacts 1102 and 1104 to finish the device.

Figure 19:
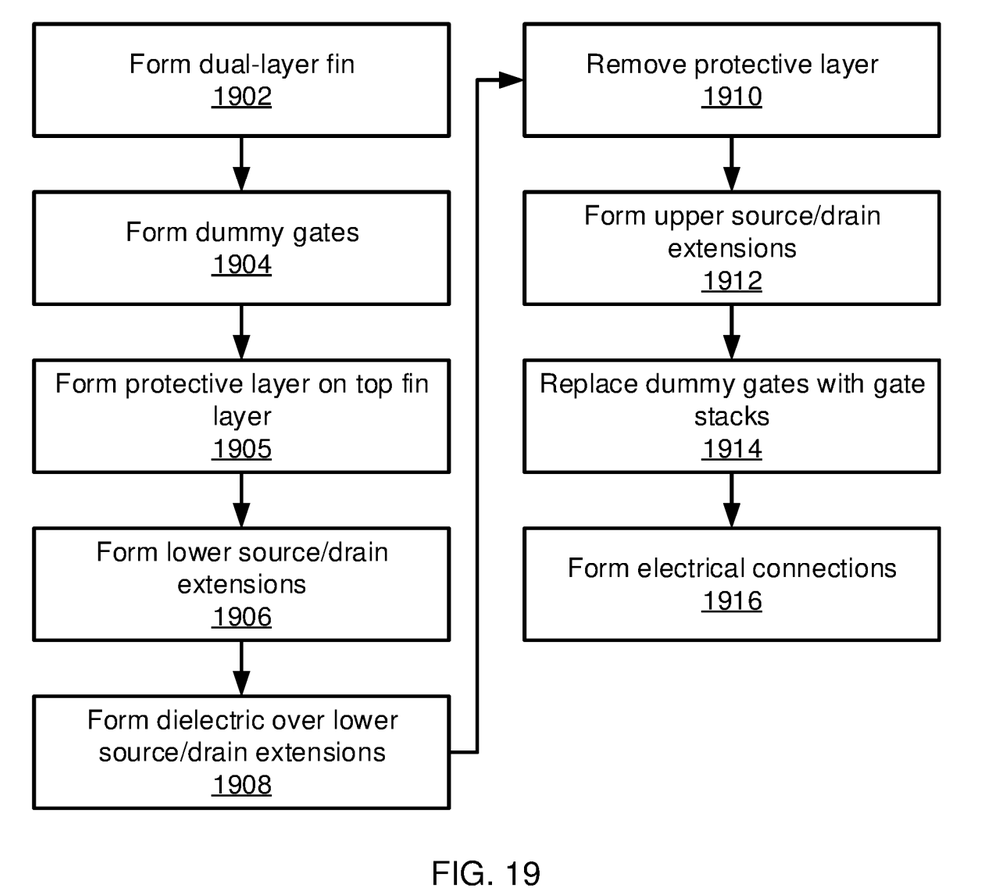
FIG. 19 is a block/flow diagram of an embodiment of a method for forming a dual-fin semiconductor device with stacked channels and a shared gate in accordance with an embodiment of the present invention.

Referring now to FIG. 19, a method of forming a two-device layered finFET with a cladded upper source/drain region is shown. Block 1902 forms dual-layered fins 204 in one of the manners described above. For example, the dual-layered fins 204 can be formed by wafer bonding or by converting a sacrificial semiconductor layer to a dielectric. Block 1904 forms dummy gates 404 over the fins 204.

Block 1905 forms a protective layer over the top semiconductor fin 108. Block 1906 then epitaxially grows lower source/drain extensions 1502 on the lower semiconductor layer 104, forming a doped, embedded epitaxial structure over the lower semiconductor layer 104. Block 1908 forms a dielectric layer 1602/1604 over the lower source/drain extensions 1502 to protect the lower source/drain extensions 1502 from subsequent processing steps.

Block 1912 removes the protective layer 1402 and forms upper source/drain extensions 1702 by epitaxial growth, forming embedded doped source/drain structures. Block 1914 replaces the dummy gates 404 with respective gate stacks and block 1916 forms conductive contacts to finish the device.

Figure 20:
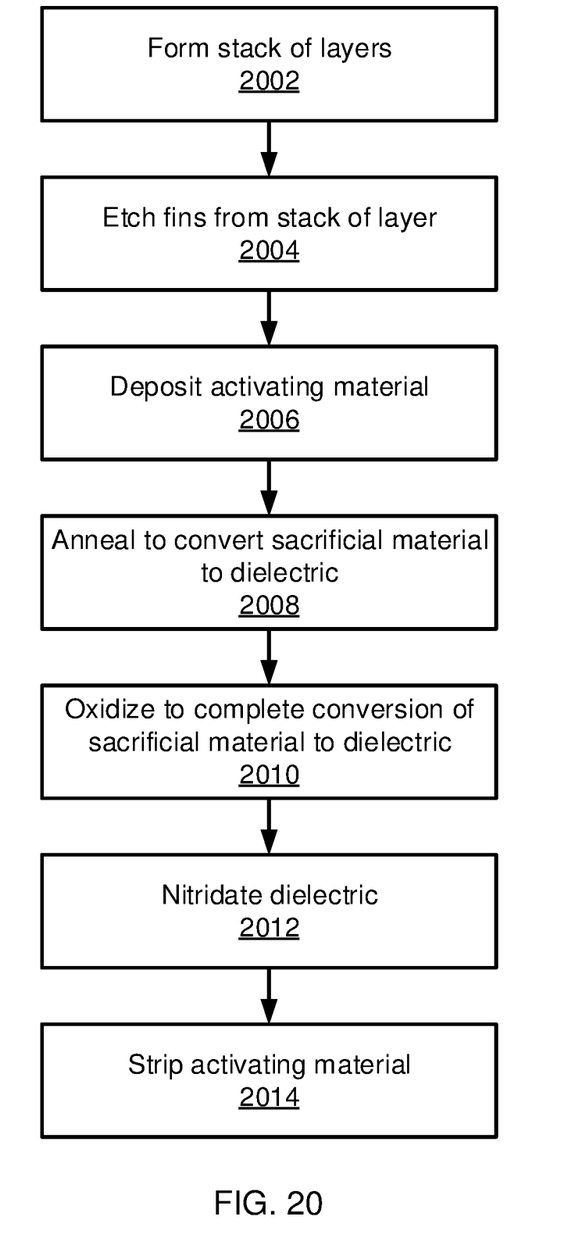
FIG. 20 is a block/flow diagram of a method of forming stacked semiconductor fins with a dielectric intermediate layer in accordance with an embodiment of the present invention.

Referring now to FIG. 20, a method of forming a dual-layer fin is shown. Block 2002 forms a stack of layers that includes a first semiconductor layer 104, an intermediate layer 106, and a second semiconductor layer 108, by successive steps of epitaxial growth. It is specifically contemplated that the first semiconductor layer 104 and the second semiconductor layer 108 may be formed from silicon, while the intermediate layer 106 may be formed from silicon germanium. Block 2004 anisotropically etches down into the stack of layers to form fins 204.

Block 2006 deposits an activating material 302 over the fins 204. It is specifically contemplated that the activating material may be germanium dioxide, deposited at a thickness of about 6 nm using any appropriate conformal deposition process. Block 2008 performs an anneal that causes a reaction between the activating material and the sacrificial material of the intermediate layer 106, converting a portion of the sacrificial material into a dielectric. Block 2010 oxidizes the remaining sacrificial material, so that the intermediate layer 106 is entirely formed from dielectric material. Block 2012 then nitridates the intermediate layer 106. The nitridation of the material removes etch selectivity with respect to silicon dioxide. Block 2014 strips away any remaining activating material.

Having described preferred embodiments of single-fin CMOS transistors with embedded and cladded source/drain structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    forming a dummy gate over a fin that comprises a lower semiconductor layer, an insulating intermediate layer, and an upper semiconductor layer to establish a channel region and source/drain regions;
    growing source/drain extensions on the lower semiconductor layer;
    growing source/drain extensions on the upper semiconductor layer, wherein one of the lower semiconductor layer and the upper semiconductor layer is embedded by the respective source/drain extensions and the other of the lower semiconductor layer and the upper semiconductor layer is cladded by the respective source/drain extensions; and
    replacing the dummy gate with a gate stack.

2. The method of claim 1, wherein the intermediate layer comprises a triple layer that includes a first outer layer of a first dielectric material, an inner layer of a second dielectric material, and a second outer layer of the first dielectric material.

3. The method of claim 2, further comprising forming the fin by:
    depositing a first layer of a first semiconductor material;
    depositing a second layer of a second semiconductor material on the first layer;
    depositing a third layer of the first semiconductor material on the second layer to form a stack;
    etching fins from the stack to expose sidewalls of the second layer;
    annealing sidewalls of the second layer to form first and second outer layers of a first preliminary dielectric material;
    oxidizing an inner layer of the second layer to form an inner layer of the second dielectric material; and
    nitridating the second layer to convert the sidewalls of the second layer to the first dielectric material.

4. The method of claim 3, further comprising depositing a layer of activating material on sidewalls of the fin before annealing the sidewalls of the second layer.

5. The method of claim 1, wherein growing the source/drain extensions on the lower semiconductor layer comprises cladding the lower semiconductor layer by growing material on sidewalls and a top surface of the lower semiconductor layer.

6. The method of claim 5, wherein growing the source/drain extension on the lower semiconductor layer further comprises growing material on an underlying semiconductor layer to form an electrical contact.

7. The method of claim 5, further comprising etching away the upper semiconductor layer and the intermediate layer in the source/drain regions before growing the source/drain extensions on the lower semiconductor layer.

8. The method of claim 1, wherein growing the source/drain extensions on the upper semiconductor layer comprises cladding the upper semiconductor layer by growing material on sidewalls and a top surface of the upper semiconductor layer.

9. The method of claim 8, further comprising forming a protective layer on the upper dielectric layer in the source/drain regions before growing the source/drain extensions on the lower semiconductor layer.

10. The method of claim 1, wherein growing the source/drain extensions on the upper semiconductor layer is performed after growing the source/drain extensions on the lower semiconductor layer.

11. The method of claim 10, further comprising forming a passivating insulator layer over the source/drain extensions on the lower semiconductor layer before growing the source/drain extensions on the upper semiconductor layer.

12. A method of forming a semiconductor device, comprising:
    forming a dummy gate over a fin that comprises a lower semiconductor layer, an insulating intermediate layer, and an upper semiconductor layer to establish a channel region and source/drain regions;
    performing an epitaxial growth process that grows source/drain extensions on the lower semiconductor layer, and also grows material on an underlying semiconductor substrate layer to form an electrical contact;
    growing source/drain extensions on the upper semiconductor layer; and
    replacing the dummy gate with a gate stack.

13. The method of claim 12, wherein growing the source/drain extensions on the lower semiconductor layer comprises cladding the lower semiconductor layer by growing material on sidewalls and a top surface of the lower semiconductor layer.

14. The method of claim 13, further comprising etching away the upper semiconductor layer and the intermediate layer in the source/drain regions before growing the source/drain extensions on the lower semiconductor layer.

15. The method of claim 12, wherein growing the source/drain extensions on the upper semiconductor layer is performed after growing the source/drain extensions on the lower semiconductor layer.

16. A method of forming a semiconductor device, comprising:
   forming a dummy gate over a fin that comprises a lower semiconductor layeran insulating intermediate layer, and an upper semiconductor layer to establish a channel region and source/drain regions;
   growing source/drain extensions on the lower semiconductor layer;
   etching away the upper semiconductor layer and the intermediate layer in the source/drain regions;
   growing source/drain extensions on the upper semiconductor layer after etching away the upper semiconductor layer and the intermediate layer in the source/drain regions; and
   replacing the dummy gate with a gate stack;
   wherein growing the source/drain extensions on the upper semiconductor layer is performed after growing the source/drain extensions on the lower semiconductor layer.

17. The method of claim 16, further comprising forming a passivating insulator layer over the source/drain extensions on the lower semiconductor layer before growing the source/drain extensions on the upper semiconductor layer.

* * * * *